(12) United States Patent
Fan

(10) Patent No.: US 7,110,253 B2
(45) Date of Patent: Sep. 19, 2006

(54) FIXING SEAT FOR INTERFACE CARD

(75) Inventor: Cheng-Yuan Fan, Taipei (TW)

(73) Assignee: First International Computer, Inc., Taipei (TW)

( * ) Notice: Subject to any disclaimer, the term of this patent is extended or adjusted under 35 U.S.C. 154(b) by 78 days.

(21) Appl. No.: 10/965,882

(22) Filed: Oct. 18, 2004

(65) Prior Publication Data
US 2006/0002073 A1 Jan. 5, 2006

(30) Foreign Application Priority Data
Jun. 30, 2004 (TW) ............... 93119778 A

(51) Int. Cl.
G06F 1/16 (2006.01)
(52) U.S. Cl. .................... 361/686; 361/683
(58) Field of Classification Search ............... 174/52.1; 361/683, 686
See application file for complete search history.

(56) References Cited

U.S. PATENT DOCUMENTS 6,700,791 B1 * 3/2004 Zappacosta ............... 361/759
6,738,261 B1 * 5/2004 Vier et al. ................. 361/740
6,937,467 B1 * 8/2005 Hsu ........................ 361/686
6,972,370 B1 * 12/2005 Wang et al. ............. 174/52.1
2002/0075638 A1 * 6/2002 Chen ........................ 361/683
2004/0047123 A1 * 3/2004 Shih-Tsung ............. 361/686
2005/0047080 A1 * 3/2005 Hsu ........................ 361/686

* cited by examiner

Primary Examiner—Hung V. Ngo
(74) Attorney, Agent, or Firm—Troxell Law Office, PLLC

(57) ABSTRACT

A fixing seat for an interface card including a first plate, a second plate and a third plate connected in a sequence, in which a step shape is formed between each two adjacent plates. A clamping portion is formed by bending the relative ends of the first plate and the second plate and a bucking ear is formed by bending each one of two ends of the third plate. An interface card can be combined with an output/input bracket of a computer housing faster and stably without using screws and any matching fixing structure is unnecessarily disposed in the computer housing and the output/input bracket so as to simplify the structure for fixing the interface card.

7 Claims, 4 Drawing Sheets

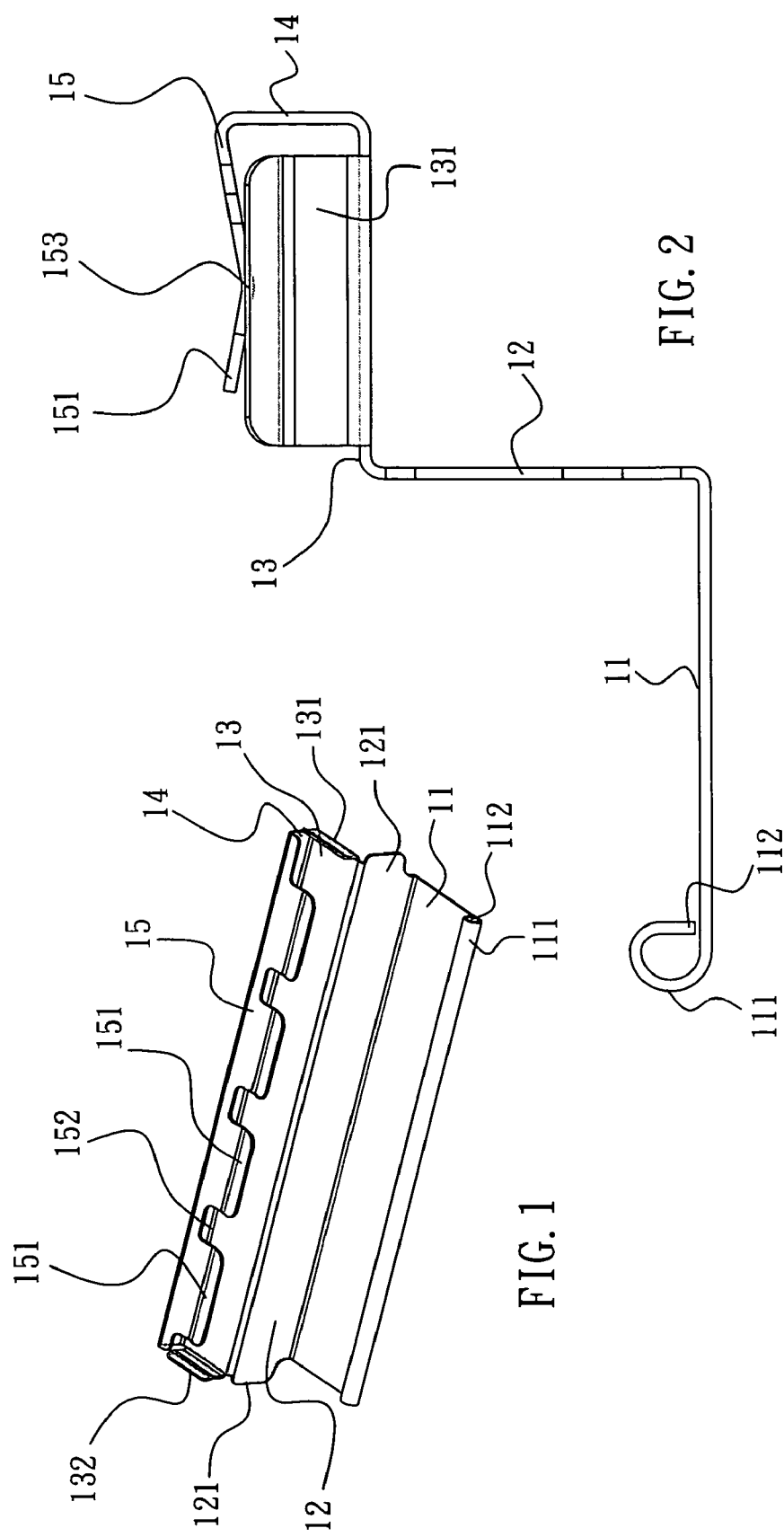

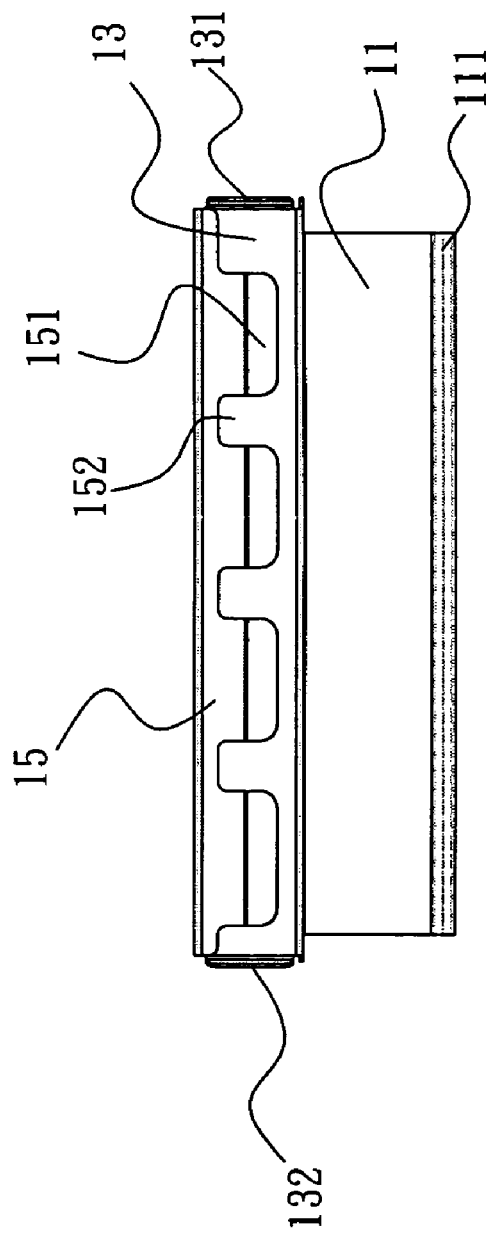
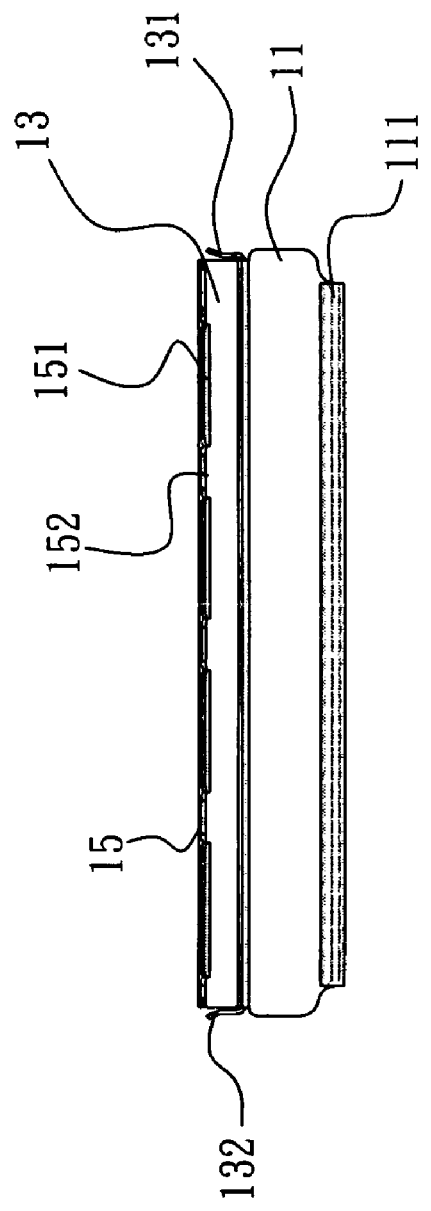

FIXING SEAT FOR INTERFACE CARD

BACKGROUND OF THE INVENTION

1. Field of the Invention

The present invention relates to a fixing seat for an interface card, and more particularly to a fixing seat used for allowing an interface card or retaining bracket to be fixed on an output/input bracket on a housing of a computer.

2. Description of Related Art

The conventional interface card (also called as expansion card) is fixed on an output/input bracket on a housing of a computer through screws. A fixing apparatus disclosed in Taiwan Patent No. 491,487 comprises a fixing element with a fixing mechanism disposed at each one of the both ends thereof. A plurality of positioning pins are disposed on the same plane of the fixing element and a plurality of fixing holes and matching holes corresponding to the positioning pins on the fixing mechanisms of the fixing element are disposed in the output/input bracket on the housing of the computer. The fixing mechanism at one end of the fixing element is connected first to the corresponding fixing hole in the output/input bracket and the one at another end thereof is then connected to another fixing hole while assembling. Finally, the positioning pins are inserted into the matching holes. Whereby, the interface card and the retaining bracket can be fixed even if the screws are not needed to connect the fixing element with the output/input bracket.

A several kinds of fixing apparatuses are respectively disclosed in the U.S. patents such as U.S. Pat. Nos. 6,693, 802, 6,231,139, 5,936,835, 5,757,618 and 5,694,291, they all are used to fix an interface card on an output/input bracket on a housing of a computer.

The corresponding fixing mechanisms and fixing holes are disposed respectively on the fixing element and in the output/input bracket of the housing of a computer or corresponding screw holes are disposed in both of them for screws to be engaged with in the fixing apparatus disclosed in the all patents mentioned above.

SUMMARY OF THE INVENTION

For providing a particular fixing seat capable of connecting with an output/input bracket of a housing of a computer conveniently without opening corresponding fixing holes or screw holes in the housing of the computer and the output/input bracket and allowing the manufacturing of the computer housing, the output/input bracket and the structure for fixing an interface card to be simpler, the present invention is proposed.

The main object of the present invention is to provide a fixing seat for an interface card, capable of connecting a computer housing with an output/input bracket directly without disposing any matching fixing structures in a computer housing and output/input bracket so as to simplify the structure for fixing an interface card.

Another object of the present invention is to provide a fixing structure for an interface card, capable of connecting a computer housing with an output/input bracket more fast and stably without using screws to fix an interface card.

For attaining to the objects mentioned above, a fixing seat for an interface card according to the present invention comprises a first plate, second plate and third plate connected in a sequence, in which a step shape is formed between each two adjacent plates. A clamping portion is formed by bending the relative ends of the first plate and the second plate and a bucking ear is formed by bending each one of two ends of the third plate. Whereby, the two clamping ears of the third plate are respectively allowed to engage with the two ends of a connecting plate of an output/input bracket and a supporting portion of the first plate and the second plate are then propped against the two ends of a side plate of a computer housing. Therefore, the gap between the computer housing and the connecting plate can be shielded by the second plate and a connecting end of an interface card can be fixed between the third plate and the connecting plate.

BRIEF DESCRIPTION OF THE DRAWINGS

The present invention can be more fully understood by reference to the following description and accompanying drawings, in which:

FIG. 1 is a prospective view, showing a fixing seat according to the present invention;

FIG. 2 is a right side view, showing a fixing seat according to the present invention;

FIG. 3 is a top view, showing a fixing seat according to the present invention;

FIG. 4 is a front view, showing a fixing seat according to the present invention;

DETAILED DESCRIPTION OF THE PREFERRED EMBODIMENTS

Figure 5:
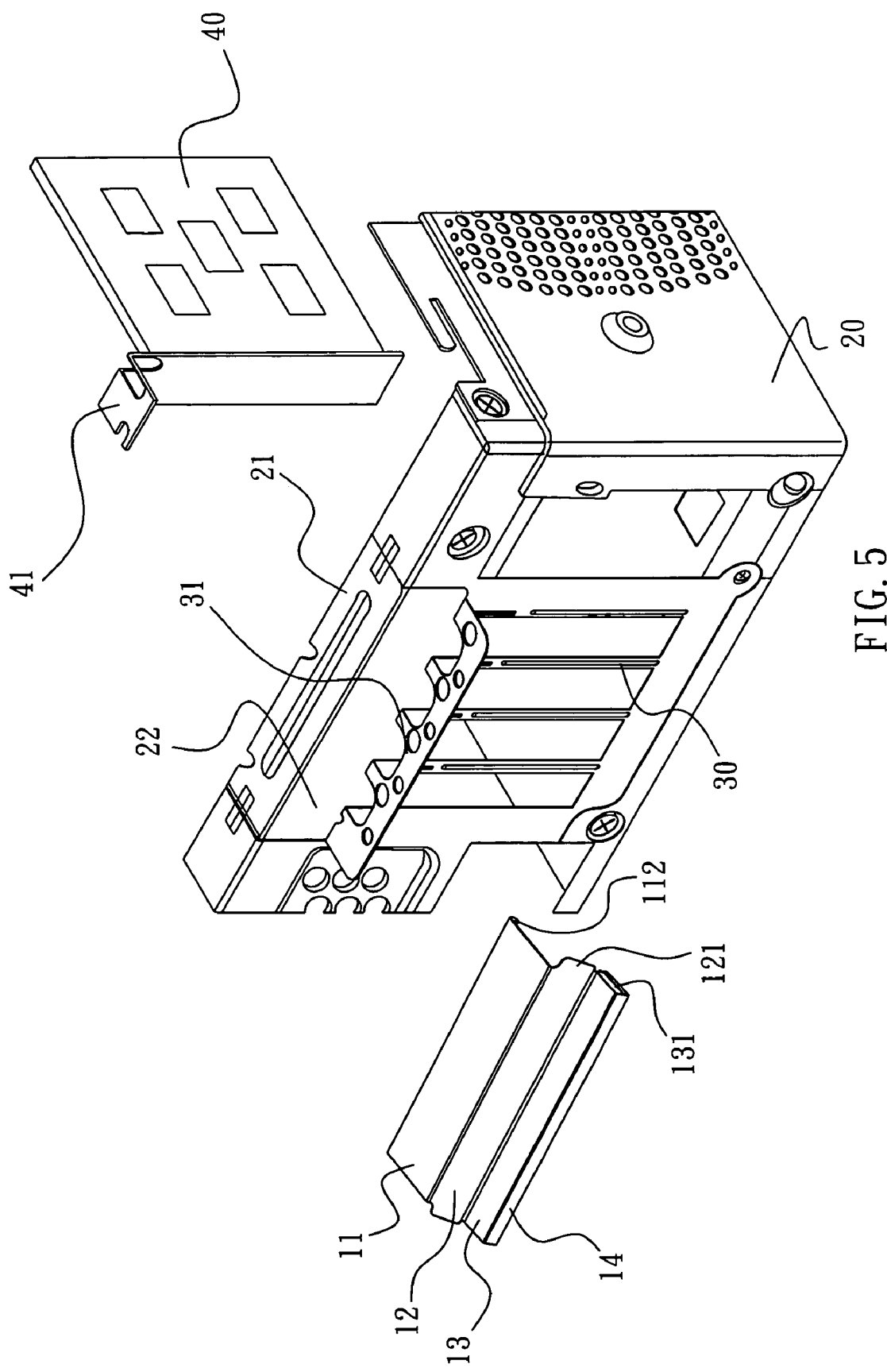
FIG. 5 is a prospective view, showing a fixing seat and an output/input bracket of a computer housing before assembling according to the present invention.

First, please refer to FIGS. 1–4. A fixing seat for an interface card comprises a first plate 11, second plate 12, third plate 13, fourth plate 14 and fifth plate 15 connected in a sequence, in which a bending angle of 90° formed between each two adjacent plates is better. A step shape is formed between each two adjacent ones of the first, second and third plates 11, 12 and 13. A bent clamping portion 111 is disposed at the first plate 11 and the clamping portion 111 is facilitated with a tail section 112; the tail section 112 and the second plate 12 are respectively disposed at the two relative ends of the same face of the first plate 11. two projecting sheets 121 are respectively extended out form the two ends of the second plate 12 and two buckling ear 131 and 132, which are disposed respectively at the two ends of the same face of the fourth plate 14, are respectively bended out at the two flank sides of the third plate 13. The third plate 13 and the fifth plate 15 are respectively disposed at the relative ends of the same face of the fourth plate 14. At least one elastic sheet 151, in which a bending section 153 near to the third plate 13 is disposed, is extended levelly from the fifth plate 15. A gap 152 exists between each two adjacent elastic sheets 151.

Figure 6:
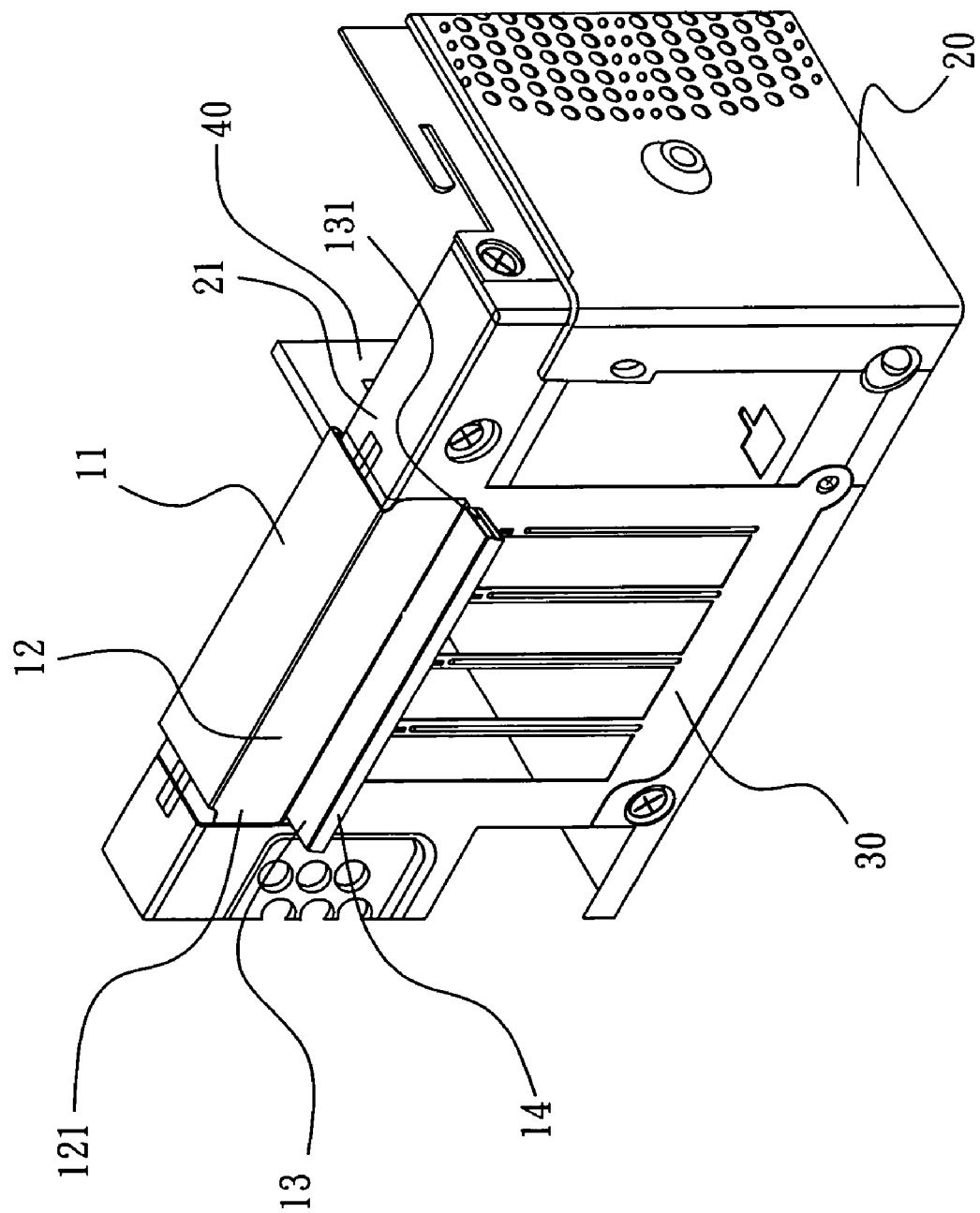
FIG. 6 is a prospective view, showing a fixing seat connected with an output/input bracket of a computer housing after assembling according to the present invention.

Please refer to FIGS. 1, 5 and 6. The sizes of the first, the second and the third plates 11, 12, 13 are respectively corresponded to (matched with) the sizes of a side plate 21, gap 22 and a connecting plate 31 of an output/input bracket 30 of a computer housing 20. When a user wants to combine the computer housing 20 and the output/input bracket 30 with the fixing seat according to the present invention to fix an interface card 40, he first places a connecting end 41 of the interface card 40 above the connecting plate 31 of the output/input bracket 30 and then cause the elastic sheets 151 of the fifth plate 15 to be propped against the lower end of the connecting plate 31. Thereafter, the two buckling ears 131 and 132 are caused to engage respectively with the two ends of the connecting plate 31 of the output/input bracket 30. Finally, the tail section 112 of the clamping portion 111 of the first plate 11 and the second plate 12 are caused to prop respectively against the two ends of the side plate 21 of the computer housing 20. Whereby, the connecting end 41 of the interface card 40 can be allowed to fix between the third plate 13 and the connecting plate 31 fast and stably.

Meanwhile, the gap 22 is shielded by the second plate 12, the projecting sheets 121 are propped against the computer housing 20 and the connecting end 41 of the interface card 40 and the connecting plate 31 are sandwiched between the third plate 13 and the elastic sheets 151. If the fixing seat is made from a metal material, the ground of the interface card, the output/input bracket 30 and the computer housing 20 can be electrically connected well. And, the second plate 12 is used to shield the gap 22 so that a magnetic radiation can also be prevented.

A fixing seat according to the present invention can also be a design with only a first plate, second plate and third plate. Two buckling ears of the third plate are respectively used to engage with the two ends of a connecting plate of an output/input bracket. And then, a clamping portion of the first plate and the second plate are caused to prop respectively against the two ends of a side plate of a computer housing; this can also attain to the effect allowing the fixing seat and the connecting plate to fix an interface card.

The fixing seat formed into one body according to the present can be used to connect the computer housing with the output/input bracket directly without the necessity to open the corresponding fixing holes or screw holes in the computer housing and the output/input bracket so that the manufacturing of the structure for fixing the interface card can be allowed to be simpler and more time saving.

The designs of the clamping portion, the second plate, the two buckling ears, the third plate and the elastic sheets disclosed in the present invention can allow the fixing seat, the computer housing and the output/input bracket to be combined more fast and stably and the interface card to be fixed in the output/input bracket of the computer housing.

It is noted that the fixing seat for an interface card described above is the preferred embodiment of the present invention for the purpose of illustration only, and are not intended as a definition of the limits and scope of the invention disclosed. Any modifications and variations that may be apparent to a person skilled in the art are intended to be included within the scope of the present invention.

What is claimed is:

1. A fixing seat for an interface card, comprising a first plate, second plate and third plate connected in a sequence, a step type being formed between each said two adjacent plates; a clamping portion being formed by bending the relative ends of said first plate and said second plate; a buckling ear being formed by bending each one of two ends of said third plate; whereby, said two buckling ears of said third plate being respectively engaged with two ends of a connecting plate of an output/input bracket, said clamping portion of said first plate and said second plate being respectively engaged with two ends of side plate of a computer housing, a gap between said computer housing and said connecting plate being shielded by said second plate and an interface card being fixed between said third plate and said connecting plate.

2. The fixing seat according to claim 1, wherein said clamping portion and said second plate are respectively located at relative ends of a same face of said first plate.

3. The fixing seat according to claim 1, said third plate being further connected with a fourth plate at a relative edge and a relative face to said second plate, said fourth plate being further connected to a fifth plate; said third plate and said fifth plate being respectively disposed at the relative ends of the same plate of said fourth plate; at least one elastic sheet being extended levelly from said fifth plate.

4. The fixing seat according to claim 2, wherein a tail section is disposed at said clamping portion, said tail section and said second plate are respectively disposed at the relative ends of said first plate.

5. The fixing seat according to claim 3, wherein the fifth plate has a bending section disposed in said elastic sheet.

6. The fixing seat according to claim 3, wherein that at least one elastic sheet includes at least two elastic sheets, a gap exists between two adjacent elastic sheets of the at least two elastic sheets.

7. The fixing seat according to claim 3, wherein two projecting sheet are extended from the two ends of said second plate.

* * * * *